Dec. 3, 1968 J. J. VANDEGRAAF 3,414,826
VOLTAGE-CONTROLLED OSCILLATOR
Filed April 3, 1967
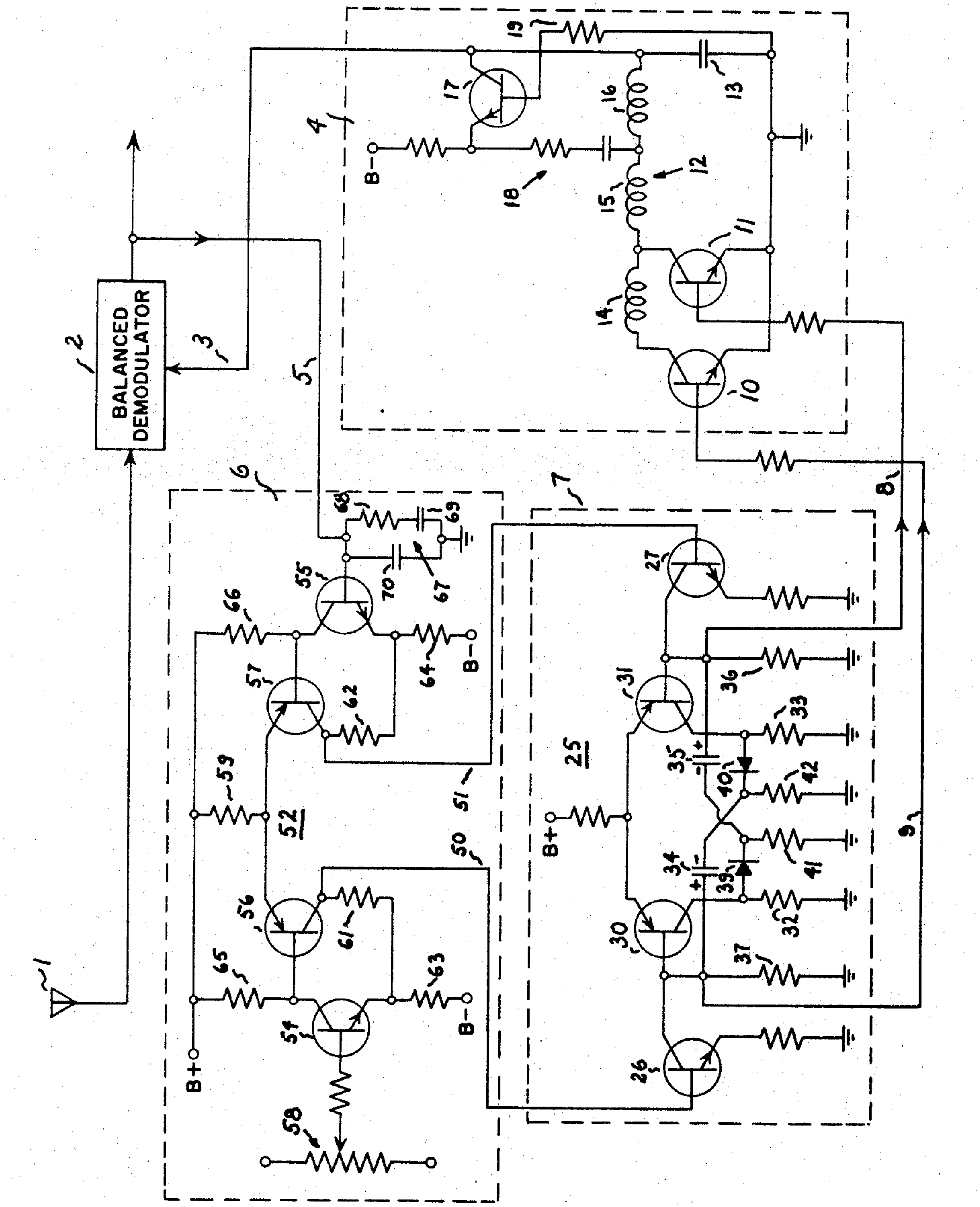
INVENTOR:
JOHANNES J. VANDEGRAAF,
BY S. David Blumenfeld
HIS ATTORNEY.

United States Patent Office 3,414,826

Patented Dec. 3, 1968

3,414,826

VOLTAGE-CONTROLLED OSCILLATOR

Johannes J. Vandegraaf, Lynchburg, Va., assignor to General Electric Company, a corporation of New York Filed Apr. 3, 1967, Ser. No. 628,062
10 Claims. (Cl. 329—124)

ABSTRACT OF THE DISCLOSURE

A voltage-controlled, variable frequency oscillator is described in which time-ratio control of a pair of switches controlling the magnitude of the tank circuit inductance is utilized to vary the frequency of the oscillator. A modified Hartley oscillator is provided which includes a pair of switching transistors to insert and remove inductance from the frequency-determining circuit. The switching transistors are switched at a fixed rate, which is high relative to the oscillator frequency. The interval for each switch may be varied, so that the oscillator frequency is a function of the duration the increment of inductance is switched out of the circuit during each switching cycle. A free-running multivibrator is used as a switching pulse generator, and it is controlled to vary the relative duty cycles of each of the active devices in the multivibrator thereby varying the duration of the switching pulse for each switch.

This invention relates to a variable frequency oscillator and, more particularly, to a voltage-controlled oscillator in which the inductance of the frequency-controlling circuit of the oscillator is cyclically switched at a fixed rate but for varying intervals during each cycle.

An oscillator whose frequency can be varied rapidly, linearly, and accurately in response to a control voltage or other signal has many useful applications in the field of communications. An oscillator of this type can be used in demodulating or detecting circuitry, frequency control arrangements—in fact, in any environment in which the frequency of an oscillator must be accurately and rapidly changed in response to some form of electrical control signal. Hitherto, voltage-controlled, variable-frequency oscillators have taken forms which make it extremely difficult to design such an oscillator for stable, low-frequency operation. Nor has it been possible to obtain frequency control which is linear over the desired frequency range or which is symmetrical about the operating center frequency. One well known, presently available voltage-controlled oscillator configuration is of a type utilizing a voltage-controlled semiconductor variable capacitor (customarily referred to as a "varactor" or "varicap") in the frequency-determining circuit of the oscillator. A control voltage is applied to the varactor to vary its capacitance and, hence, the frequency of the oscillator. These voltage-controlled capacitances are reverse-biased PN junctions in which the depletion layer at the junction of the device is varied in response to the control signal, thereby effectively varying the capacitance exhibited by the device. Varactors, however, are basically non-linear devices and, as such, present many difficulties when utilized to vary the frequency of an oscillator. The capacitance variations with voltage are $$\frac{1}{\sqrt{v}} \text{ or } \frac{1}{3\sqrt{v}}$$

depending on whether the junction is abrupt or graded. The capacitance v. frequency curves are exponential in character, so that the capacitance variation per incremental voltage change varies along different portions of the curve. Thus, for one range of voltages the capacitance change is rapid and the control sensitivity is high; but for another range of voltages, the capacitance variations are small and the control sensitivity is low. Therefore, it is extremely difficult to produce linear frequency excursion, and to control the oscillator accurately, and it is particularly difficult to control the frequency excursion symmetrically about the center frequency.

Furthermore, the use of voltage-sensitive capacitors of the varactor type present additional difficulties with low-frequency oscillators, i.e., having frequencies of only several thousand Hertz. This difficulty comes about because of changes of the frequency at the low-frequency end, substantial capacitance variations are required to produce the desired frequency change. Varactor devices, however, are characterized by the fact that the total capacitance variation which they are capable of exhibiting is relatively low. Hence, for low-frequency oscillators, the use of varactors as the frequency-controlling device requires the use of a large number connected in parallel. Thus, for low-frequency operation, the use of varactors is expensive, as well as exhibiting very poor frequency stability due to the high circuit impedances then required.

A need, therefore, exists for a voltage-controlled variable oscillator which is capable of linear operation over the desired range, and, more particularly, of symmetrical linear operation about the desired center frequency in which the limits of the frequency excursion can be accurately controlled. Furthermore, a need exists for a voltage-controlled variable-frequency oscillator, capable of being rapidly and accurately varied at low frequencies, which is simple in construction and reliable in operation.

It is, therefore, the primary objective of the instant invention to provide a voltage-controlled oscillator which provides linear frequency variation over a desired operating range;

A further objective of the invention is to provide a linear, voltage-controlled oscillator which is simple and inexpensive to construct;

Yet another objective of the invention is to provide a voltage-controlled, variable-frequency oscillator which utilizes time-ratio control to vary one of the components in the frequency-determining network of the oscillator;

Other objectives and advantages of the invention will be apparent as the description thereof proceeds.

The various objects and advantages of the invention are realized by providing an oscillator network having a plurality of semiconductor switches connected to various points on the tuning inductance of the frequency-selective network of the oscillator. A switching pulse generator is connected to the semiconductor device, and switches them alternately at a rate which is high compared to the operating frequency of the oscillator, thereby changing the inductance by inserting and removing inductive increments from the frequency-determining circuit. This varies $r$ the resonant frequency of the oscillator rapidly between the two frequencies $f_1$ and $f_2$. The operating frequency of the oscillator depends on the time ratio of $f_1$ and $f_2$ during each switching cycle. This, in turn, is controlled by the duty cycle of a multivibrator forming part of a switching pulse generator, which is varied in response to an error or other control voltage.

The novel features which are believed to be characteristic of this invention are set forth with particularity in the appended claims. The invention, itself, however, both as to its organization and method of operation, together with further objects and advantages thereof, may best be understood by reference to the following description, taken in connection with the accompanying drawing in which:

The sole figure is a schematic circuit diagram of the voltage-controlled oscillator utilized in a demodulator circuit.

FIGURE 1 is a schematic circuit diagram illustrating a voltage-controlled oscillator constructed in accordance with the invention, which is utilized as part of a demodulator circuit which may form part of a radio receiver or the like. The oscillator illustrated there is shown as the local oscillator in a phase-locked loop for demodulating an incoming modulated signal which may be of the vestigial sideband type or the like. It will be understood, however, that the utility and applicability of the voltage-controlled oscillator of the instant invention is not limited to a demodulator circuitry of this type, and that the illustration of the circuit in this content is for convenience only, and to orient it in one context. An incoming intelligence-bearing signal, which may be audio information or digital data modulated on a carrier, is received by an antenna 1 and applied to the input of a balanced modulator 2, forming part of a phase-locked loop for demodulating the intelligence. The antenna is illustrated as being connected directly to one input of the balanced demodulator; however, it will be understood that for the sake of clarity and ease of understanding, portions of the receiver circuitry, such as RF amplifiers, automatic gain control circuitry, etc., have not been shown, although it will be understood that in a typical receiver, such additional circuits would be provided ahead of the demodulator circuit.

The phase-loop, of which the balanced demodulator forms a part, includes a variable frequency local oscillator, the output of which is applied over a suitable input lead 3 to the balanced demodulator to produce at the output thereof the intelligence which, as pointed out previously, may be in the form of audio signals or data signals, with the demodulated intelligence being applied to an output terminal and thence to any suitable utilization circuitry. The local voltage-controlled variable frequency oscillator 4, which is the subject of the instant invention, supplies a signal which is of the same frequency as the carrier component of the incoming signal, and is 90° out of phase with the carrier signal. If the local oscillator signal is of the proper frequency and phase, the intelligence is demodulated and applied to the output terminal. However, if the phase or frequency of the local oscillator signal is not correct, a DC error voltage is generated at the output of the demodulator, with the value of the DC error being an indication of the magnitude of the error and its polarity an indication of the direction of the error. This error signal from the output of the balanced modulator is applied over lead 5 to the input of a time-ratio control circuit 6, which produces a pair of control signals in response to the error voltage. The control signals are applied to a switching pulse generator 7. The pulse generator produces two trains of switching pulses for controlling a pair of switching devices in oscillator 4 to vary tuning inductance and, hence, the frequency of the oscillator. The control pulses from the time-ratio control circuit 7 control the duty cycle of a multivibrator in the pulse generator, and hence, the time duration of the pulses in each of the pulse trains. This, in turn, controls the duration each switch is conductive during each switching cycle, thereby controlling the frequency and phase of the voltage-controlled variable-frequency oscillator 4.

THE OSCILLATOR

The variable frequency oscillator shown generally at 4 is a modified Hartley oscillator which includes a pair of semiconductor switches 10 and 11 connected at various points along the frequency-determining tuning inductance of a frequency-determining LC circuit, which consists of a multi-section inductor 12 and capacitor 13.

The switches are alternately driven into the conductive state by the switching pulses to change the tuning inductance and the oscillator frequency rapidly between the values $f_1$ and $f_2$. The switching rate is constant and high relative to $f_1$ and $f_2$. However, the duration that each of the switches is in the conductive state is varied in response to a control signal, so that the oscillator frequency is at some intermediate value between $f_1$ and $f_2$ depending on the time ratio of the conductive states of the switches. By changing this ratio the frequency is correspondingly changed between the limiting values $f_1+f_2$.

The frequency-controlling tuning inductance 12 of the tank circuit consists of three series inductors 14, 15 and 16, which are wound on a common core, not shown, with semiconductor switch 10 connected between one end of inductor 14 and ground, and switch 11 connected between the junction of inductors 14 and 15 and ground. An NPN transistor 17 is provided as the active feedback device to sustain oscillation. Transistor 17 has its emitter connected through an RC network 18 to the junction of inductors 15 and 16, a collector connected to one end of the tuning inductance 12 at the junction of inductor 16, and frequency-determining capacitor 13 and a base connected through a current-limiting resistor 19 to ground potential and, hence, to the other end of the tuning inductance.

The semiconductor switching devices 10 and 11 are NPN transistors having their collectors connected at various points along the tuning inductance and their emitters connected to ground. The bases are connected through current-limiting resistors and through leads 8 and 9 to the output of switching pulse generator 8. The switching pulses from the generator alternately drive transistor 10 and 11 into conduction, and it will be apparent that when transistor 11 is conducting and in saturation, the collector-emitter path of transistor 11 effectively short-circuits the junction of inductors 14 and 15 to ground, so that only inductors 15 and 16 are in the frequency-determining LC network of the oscillator. With transistor 10 in the conductive state, the transistor 11 in the non-conductive state, the far end of inductor 14 is connected to ground and the LC network includes all three inductors 14, 15 and 16. As switches 10 and 11 are alternately switched into the conducting state, switching inductor 14 in and out of the circuit, the frequency is varied between a lower limit $f_1$, with switch 10 in the conducting state and all the inductor sections included, and an upper limit $f_2$, with switch 11 in the conducting state and inductor 14 removed from the frequency-determining tank circuit.

For inductors using a high-permeability core material, the stored energy in the inductor is concentrated in the magnetic circuits and not in the winding (disregarding stray fields which may be considered negligible). Consequently, the energy condition in the inductor is not changed when inductor 14 is switched in and out of the circuit. Therefore, the amplitude and phase of the voltage across the resonant circuit does not change discontinuously when switching takes place. However, the resonant frequency of the circuit obviously changes. If the rate at which inductor section is switched in and out of the circuit is high compared with the resonant frequency of the circuit (for example, 10–20 times), the resonant frequency is weighted average of $f_1$ and $f_2$, with the exact value depending on the time ratio or duty cycle of the switching transistors, i.e., the duration that each one of the switching transistors is in the conducting state. In other words, the resonant frequency $f$ of the oscillator is $$f=q_1+1-q)f_2 \qquad (1)$$

where $$q=\frac{t_1}{T} \qquad (2)$$

where $t_1$=the time that switching transistor 10 is in the conducting state, and $T$=the cycle time, i.e., the period during which both switching transistors 10 and 11 go through one switching cycle.

By controlling the duty ratio, the frequency can be changed linearly and symmetrically over the frequency range $f_1-f_2$. By controlling the time ratio $q$ between the two extremes, i.e., $t_1=T$ in which case $f=f_1$ and $t_1=0$, in which case $f=f_2$, the frequency of the oscillator can be changed in a linear manner between these two bounds.

THE PULSE GENERATOR

One way to accomplish this change in resonant frequency is, as pointed out above, by controlling the relative duration of the switching pulses applied to the bases of transistor switches 10 and 11 in response to the error signal from the balanced demodulator. To this end, the switching pulse generator 7 includes a free-running multivibrator shown generally at 25 which produces a pair of switching pulse trains of predetermined repetition rate but of varying duration. The duration of the pulse trains are controlled differentially in response to the control or error signal, so that the increase in the duration of one results in a decrease of the duration of the other. The duty cycle of the free-running multivibrator 25 is controlled by a pair of control transistors 26 and 27, which are connected in the RC timing paths of the multivibrator and are controlled in response to the output control signal from time-ratio control circuit 6. The control transistors 26 and 27 have their conductive states controlled in response to these control signals and act as a current source to control the discharge time of the RC circuit associated with each of the transistor devices of the multivibrator to control their on-off time ratio. This, as will be obvious, controls the duration of the switching pulses for the oscillator switches.

The free-running multivibrator 25 consists of a pair of PNP transistors 30 and 31 having their emitters connected to the B+ terminal of a supply source and their collectors through suitable collector resistors 32 and 33 to ground. The base of each transistor is coupled through a regenerative feedback path to the collector of the other through RC-timing circuits consisting of capacitors 34 and 35 and discharge resistors 37 and 38. Diodes 39 and 40 are connected between the collectors of transistors 30 and 31 and the junctions of capacitors 34 and 35 and resistors 40 and 41 respectively.

The time interval that each transistor conducts, and hence the duration of the output pulse from its collector, is a function of the time required to discharge capacitors 34 and 35. This, in turn, is controlled both by fixed discharge resistors 37 and 38, and the conductivity of the transistors 26 and 27 connected in shunt with the resistors. The emitter-collector paths of transistors 26 and 27 are connected in shunt with resistors 37 and 38, and the rate at which the capacitors are discharged depends on the amount of current being drawn by transistors 26 and 27. The amount of current being drawn by these transistors is, in turn, determined by the control signal applied to their base electrodes from the time-ratio control circuits, thereby controlling the duty cycle of the multivibrator.

Assuming that transistor 31 is conducting, and transistor 30 not, transistor 31 is in a saturated condition, and both the emitter-base and the base-collector junctions are forward-biased, and the resistance of the collector-emitter path is extremely low. Consequently, both the base and collector of transistors 31 are essentially at the B+ potential. The positive voltage at the collector of transistor 31 is applied over lead 8 to the base of NPN transistor switch 11, driving it into saturation and grounding the junction of inductors 14 and 15. The voltage at the collector of transistor 30 is substantially at ground potential, so that the voltage applied to the base of switch 10 over lead 9 maintains switch 11 in the non-conducting state. It will be seen, therefore, that as long as transistor 31 remains in the conducting state, the frequency of the oscillator is determined by the sum of inductor sections 15 and 16, and the oscillator frequency is at its highest value $f_2$.

During the interval that transistor 31 is conducting, capacitor 35 was charged rapidly through resistor 41 to the value of the voltage at the base of the transistor, which, as pointed out before, is essentially at the B+ value. Capacitor 35, therefore, charges to the value of B+, with the right-hand plate of the capacitor charged positively with respect to the other plate, as shown by the plus (+) and minus (−) signs. The positive voltage on capacitor 34, on the other hand, is discharging at a rate determined by the current drain of transistor 26, which is connected to the junction of resistor 37 and capacitor 34. Whenever capacitor 34 has discharged sufficiently so that the base of transistor 30 is now more negative than its emitter, transistor 30 is driven into conduction and saturates. The collector-emitter resistance drops to a very low value and the voltage at its collector goes suddenly from ground to approximately B+. When the collector of transistor 30 goes to B+, diode 40 is driven into the conductive state, connecting capacitor 35 to the collector of transistor 30. With the collector of transistor 30 now at B+ and capacitor 35 charged to B+ with the polarity shown, the base of transistor 31 is suddenly driven more positive than its emitter by the amount of the voltage on capacitor 35, since capacitor 35 cannot discharge instantaneously through resistors 36 and transistor 27. That is, with the right plate of capacitor 35 more positive than the left-hand plate by a voltage equal to B+, and the collector of transistor 30 also approximately at B+, the voltage at the base of transistor 31 is 2 B+ and, hence, the base is more positive than the emitter and PNP transistor 31 is driven into cut-off. Transistor 31 remains cut off until capacitor 35 has discharged sufficiently through transistor 27 and resistor 38 to reduce the voltage at the base of transistor 31 to a point where it is slightly more negative than the emitter voltage. This cycle is repeated continuously with first one and then the other of the transistors conducting to produce switching pulses.

As pointed out previously, the time interval required for this capacitor to discharge is controlled by the conductivity and the current flow through transistor 27. That is, with the capacitor charged so that the righthand plate is positive, electrons flow from the emitter of transistor 26 to the collector and then into capacitor 35 to discharge the capacitor at a rate depending on the magnitude of the collector current. By controlling the current drawn by these transistors 26 and 27, the discharge time of the respective capacitors 35 and 34 may be correspondingly varied to control the duty cycle of the multivibrator and the relative time duration of the pulses in the individual switching pulse trains.

If both transistors 26 and 27 are equally conductive and have equal collector currents, the discharge time for the capacitors 34 and 35 is equal, transistors 30 and 31 conduct for equal periods of time and the duty cycle for the multivibrator is 50%. The switching pulses in the individual pulse trains which actuate switching transistors 10 and 11 are also of equal duration, and the oscillator frequency $f$ is midway between $f_1$ and $f_2$, i.e., $$f=\frac{f_1+f_2}{2}$$

If the transistor 26 is conducting more heavily than transistor 27, capacitor 34 is discharged more rapidly than capacitor 35, so that transistor 31 stays in the non-conducting state for a longer time than transistor 30, or conversely, transistor 30 conducts for a longer part of the cycle than transistor 31. The duration of the output pulses from collector of transistor 30 is, therefore, greater than of those at the collector of transistor 31 by an amount depending on the difference in the current drawn by transistors 26 and 27. Oscillator transistor switch 10, therefore, conducts for a longer period of time during each cycle than does switch 11, so that the resonant frequency of the oscillator is reduced from its value midway between $f_1$ and $f_2$, the exact value of the frequency being equal to the weighted average of the two in accordance with Formula 1 described previously. Similarly, if transistor 27 is conducting more heavily than transistor 26, capacitor 35 is discharged more rapidly than capacitor 34, and transistor 31 now conducts for a longer time than transistor 30. The duration of the switching pulses at the collector of transistor 31 is now greater than those at transistor 30, and oscillator-switching transistor 11 conducts for a greater portion of the cycle than switching transistor 10, thereby increasing the oscillator frequency towards $f_2$ by an amount equal to the ratio of the switching times. In this manner, the duty cycle of the free-running multivibrator accurately and linearly controls the operating frequency of oscillator 4 between two fixed values, $f_1$ and $f_2$.

THE TIME RATIO CONTROL CIRCUIT

Transistors 26 and 27 are controlled by signals from time-ratio control circuit 6, which are a function of the magnitude and sign of an input signal which, in this instance, is the error signal from the balanced demodulator 2. The bases of transistors 26 and 27 are connected by leads 50 and 51 to a differential amplifier shown generally at 52, the output of which varies differentially as a function of the error signal. Differential amplifier 52 includes a pair of NPN control transistors 54 and 55, and a pair of PNP transistors 56 and 57 connected as a differential amplifier. The bases of control transistors 54 and 55 are connected respectively to a source of reference potential 58 and input lead 6 from the output of balanced demodulator 2. The reference signal and the error signal respectively control the output voltage at the collectors of transistors 54 and 55, which are, in turn, connected to PNP transistors 56 and 57. The emitters of transistors 56 and 57 are connected through a common emitter-resistor 59 to the B+ terminal of a source of supply voltage, and the collectors are connected through collector-resistors 61 and 62 and the emitter-resistors 63 and 64 of transistors 54 and 55 and the B− terminal of the supply voltage. The base bias for transistors 56 and 57 is thus established by a voltage divider connected between the B+ and B− terminals, consisting of the series connected resistor 64, collector emitter path of transistor 55, and resistor 66 in the case of transistor 57, and resistor 65, the collector-emitter path of transistor 54 and resistor 63 in the case of transistor 56. For a given setting of the slides on voltage reference source 58, the conductive state of transistor 54 and the voltage at its collector is at a predetermined level which controls the conductive state of transistor 56. The conductive state of transistor 57 produces a voltage drop across common emitter-resistor 59 which, in turn, controls the biasing condition of its associated transistor 57, so that a differential effect at the collector output of these transistors is produced as the input voltage varies.

The error signal appearing at line 6 is applied to the filter circuit shown generally at 67 connected between the base of transistor 55 and ground. Filter 67 consists of series connected resistor 68 and capacitor 69, shunted by capacitor 70. The DC error voltage is applied to network 67, which removes any AC signal component. The biasing conditions for transistors 54 and 55 are initially adjusted so that with no error voltage at lead 6, transistor 54 and 55 are conducting equally so that the output voltage at their collectors is also equal. That being so, transistors 56 and 57 of the differential amplifier are conducting equally and the voltages at their collectors, which is the control voltage signal for transistors 26 and 27, are also equal. Transistors 26 and 27, therefore, have equal collector currents, and the duty cycle of the free-running multivibrator is 50%. The duration of the switching pulses in each of the pulse trains from the multivibrator is equal. Oscillator switches 10 and 11 conduct for an equal period of time, and the output frequency of the oscillator is equal to $$\frac{f_1+f_2}{2}$$

Whenever an error signal appears on lead 6, the conductive state of transistor 55 is changed by an amount determined by the magnitude and sign of the error, and, consequently, the voltage at its collector; and, hence, the input voltage to transistor 57 of the differential amplifier is changed correspondingly. The output of the differential amplifier is varied differentially, with one increasing and the other one decreasing. This change in the relative magnitude of the control signal appearing over leads 50 and 51 change the conductive states of transistors 26 and 27, making one conduct more heavily and the other one less heavily. This, in turn, changes the length of time that transistors 30 and 31 conduct, varying the duty cycle of the multivibrator, and the duration of the switching pulses applied to oscillator-switching transistors 10 and 11. This change in the duty cycle of the multivibrator in response to the error voltage produces a change in the frequency and phase of the output oscillations from oscillator 4 until the local oscillator signal is again of the same frequency and 90° out of phase with the carrier component of the modulated vestigial sideband signal received by antenna 1. In this manner, the frequency and phase of the oscillator output is varied between the two values $f_1$ and $f_2$ in response to a voltage or other control signal, to provide accurate, symmetrical and linear variations of the oscillator frequency.

It will be apparent from the above description that Applicant has provided a voltage-controlled, variable-frequency oscillator which is capable of producing frequency variations of the oscillator in response to a voltage-controlled signal, which frequency variations may be produced in a linear manner over a fixed range of frequencies, and which is capable of doing so in a symmetrical manner, both at low and high frequencies.

Although one particular embodiment of the subject invention has been described, many modifications thereof may be made; and it is understood that the invention is not limited thereto, since many modifications, both in circuit arrangement and in the instrumentality employed may be made, and it is contemplated by the appended claims to cover any such modifications as fall within the true spirit and scope of the invention.

What is claimed as new and desired to be secured by U.S. letters Patent is:

1. A frequency-selective network comprising, (a) a reactance element of one sign having a plurality of sections, (b) a reactance element of the opposite sign connected to said first-named reactance element, (c) switching means connected to the sections of the reactance element of said one sign for alternately inserting and removing one of the sections in said selective network to switch the frequency of said network between discrete values determined by the number of sections, (d) means for rapidly changing the conducting state of said switching means at a recurrent rate which is high with respect to the said discrete frequency values, whereby the frequency of the network depends on the relative time ratio of the switch conducting states including:

(1) means for supplying switching pulses for each of said switch means, the duration of said pulses for each of said switching means during the pulse period being variable, (2) means responsive to a control signal for varying the relative duration of the respective switching pulses as a function of a control signal, whereby the frequency of said selective network is determined by the time ratio of the switching pulse duration.

2. A selective network according to claim 1 in which the reactance element of said one sign is an inductor having a plurality of sections, and the reactance of the opposite sign is a capacitor connected in shunt therewith.

3. In a variable frequency oscillator, the combination comprising, (a) a frequency-determining resonant circuit, (b) an active element coupled to said frequency-determining circuit to provide positive feedback to sustain oscillations, (c) said frequency-determining resonant circuit including a plurality of tuning elements, (d) a plurality of switching means connected to said tuning elements for alternately inserting and removing one of the tuning elements in said resonant circuit and to switch the frequency between discrete values determined by the number of tuning elements, (e) means for rapidly changing the conducting state of said switching means at a recurrent rate which is high with respect to the said discrete frequency values, whereby the oscillator frequency lies in the range between said discrete values and depends on the relative time ratio of the intervals that the one tuning element is in and out of the frequency-determining resonant circuit, (1) means for supplying switching pulses for said switch means at a fixed rate which is high relative to the oscillator frequency with the duration of the switching pulses applied to the switching means during each pulse period being variable, (2) means responsive to a control signal for varying the duration of the switching pulses as a function of a control signal whereby the interval the one tuning element is in and out of the circuit is varied and the oscillator frequency is determined by the time ratio of the intervals.

4. The oscillator according to claim 3 wherein said tuning elements are a plurality of series connected inductors in shunt with a capacitor.

5. The oscillator according to claim 4 wherein said switches are transistors having their collector-emitter paths connected between said inductors and a point of reference potential.

6. The oscillator according to claim 3 wherein the means for supplying switching pulses includes a free-running multivibrator having a pair of cross-coupled active devices, means coupling the output from each of the active devices to said switches to provide the switching pulses, and means responsive to the control signal to vary the duty cycle of the active devices to vary the duration of the pulses.

7. The oscillator according to claim 3 wherein said pulse generator includes a free-running multivibrator having a pair of transistors, regenerative RC paths coupling the collector of each transistor to the base of the other transistor, a conductive device connected to the capacitor in each of the said paths, and means to vary the conductivity of the devices in response to said control signal to vary the discharge time of the capacitors and thereby the duty cycle of its associated transistor.

8. The oscillator according to claim 3 wherein said means for supplying switching pulses includes:

(1) a free-running multivibrator, the duty cycle of which is varied to provide two pulse trains having pulses of varying duration, (2) differential amplifier means responsive to an input voltage to provide control signals for said multivibrator to vary its duty cycle as a function of said input voltage.

9. In a voltage-controlled, variable frequency oscillator, the combination comprising:

(a) a frequency-determining circuit consisting of a plurality of series connected inductors in shunt with a capacitor.

(b) a transistor coupled to said frequency-determining network to furnish positive feedback and sustain oscillation, (c) a pair of transistor switches connected between different points along said series connected inductors and ground to switch one of the inductors alternately in and out of the circuit, thereby switching the resonant frequency of the circuit between $f_1$ and $f_2$, (d) a source of switching pulses for each of said switches, said switching pulse rate being high with respect to $f_1$ and $f_2$, (e) means responsive to a control voltage for varying the duration of the switching pulses and for controlling the oscillator frequency as a function of the time ratio of the switch conducting states whereby the oscillator frequency $f$ is at a value intermediate $f_1$ and $f_2$, a value depending on the time ratio in accordance with the following relationship:

$$f=\frac{t_1}{T}f_1+\left(1-\frac{t_1}{T}\right)f_2$$

where $t_1$=the time one switching transistor is conducting, and

T=the cycle time during which both switching transistors go through one switching cycle.

10. In a demodulator system, the combination comprising (a) a balanced demodulator having a first input terminal adapted to receive an information-bearing modulated carrier, a second input terminal adapted to receive a local oscillator signal bearing a predetermined phase and frequency relationship to the incoming modulated carrier, an output terminal having the demodulated intelligence appearing thereon if the local oscillator signal is of the proper frequency and phase, and an unidirectional error voltage having a magnitude and sign depending on the degree and direction of the departure of the local oscillator signal from the predetermined values, (b) a local oscillator having its output connected to said local oscillator comprising, (1) a frequency-determining resonant circuit consisting of a plurality of series connected inductors in shunt with a capacitor, (2) a pair of transistor switches connected between different points along said inductors and ground to switch one of the inductors in and out of the circuit and to switch the resonant frequency between two discrete values, (c) pulse generating means for supplying switching pulses to said transistor switches whereby the oscillator frequency is established at a value in the range between the said discrete values depending on the duration of the pulses.

(d) means to vary the duration of said switching pulses as a function of said error voltage, whereby the oscillator frequency is varied to re-establish the proper frequency and phase relationship with the incoming modulated carrier.

References Cited

UNITED STATES PATENTS

| | | | |
|---|---|---|---|
| 2,588,551 | 3/1952 | McCoy | 331—181 |
| 2,959,726 | 11/1960 | Jensen | 331—181 |
| 3,076,943 | 2/1963 | Cooperman | 331—181 |
| 3,156,883 | 11/1964 | Wells | 331—181 |
| 3,319,187 | 5/1967 | Crandall | 331—181 |

JOHN KOMINSKI, *Primary Examiner.*